United States Patent [19]

Shanks

[11] 4,250,503
[45] Feb. 10, 1981

[54] APPARATUS FOR DISPLAYING WAVEFORMS ON A MATRIX DISPLAY

[75] Inventor: Ian A. Shanks, Malvern, England

[73] Assignee: National Research Development Corporation, London, England

[21] Appl. No.: 926,723

[22] Filed: Jul. 21, 1978

[30] Foreign Application Priority Data

Jul. 26, 1977 [GB] United Kingdom ............ 31397/77

[51] Int. Cl.³ .............................................. G06F 3/14
[52] U.S. Cl. .................................. 340/754; 340/784; 340/805; 350/332
[58] Field of Search ............... 340/753, 754, 784, 802, 340/805; 350/330-333

[56] References Cited

U.S. PATENT DOCUMENTS

| 4,079,369 | 3/1978 | Fukumoto | 340/753 |
| 4,085,352 | 4/1978 | Hilton | 340/754 |
| 4,087,806 | 5/1978 | Miller | 340/802 |
| 4,119,367 | 10/1978 | Raynes et al. | 340/784 |
| 4,127,848 | 11/1978 | Shanks | 340/784 |

Primary Examiner—Marshall M. Curtis
Attorney, Agent, or Firm—Cushman, Darby & Cushman

[57] ABSTRACT

A waveform display including an opto electric display having m X electrodes and n Y electrodes arranged in a m x n element matrix. A series of m different reference binary codes are applied simultaneously one to each of the X electrodes. A waveform to be displayed is sampled and binary numbers representative of the amplitude of each sample are produced. These sample binary numbers are each converted into one of the reference binary codes for applications to the Y electrodes; the code so produced being related to both the amplitude value and the order of reference codes on the X electrodes. As a result of the simultaneous application of appropriate binary codes to each X, Y electrode, unselected X-Y intersections receive an rms voltage above a display threshold while selected X-Y intersections receive a zero voltage and collectively display the waveform.

The opto-electric display may be a liquid crystal display or an electro luminescent display. The binary codes may be an ordered series of binary numbers represented by logic zeros and ones, having a period T divided into N bits where $m = 2^N$, or period T divided into L bits and using $2^N$ codes out of a possible $2^L$ codes where L is greater than N and $m = 2^N$. Alternatively the binary code may be a pseudo random series of zeroes and ones.

21 Claims, 10 Drawing Figures

APPARATUS FOR DISPLAYING WAVEFORMS ON A MATRIX DISPLAY

This invention relates to a method and apparatus for displaying waveforms.

Conventionally waveforms are displayed on cathode ray tubes in which a stream of high energy electrons is swept across a phosphor screen where it impinges and causes a visible glow. It is possible to make such tubes very small e.g. down to about 3 cm but their power consumption is still high for a truly portable display. Also high voltages e.g. 1 to 5 kV are required.

One type of electro-optic display that has the advantage of low power consumption and low operating voltage is the liquid crystal display device. This typically comprises a thin e.g. 12 $\mu$m, layer of liquid crystal material contained between glass plates coated on their inner surfaces with electrodes. These electrodes may be arranged in the form of strips with those on one plate orthogonal to those on the other plate, i.e. a matrix of row and column electrodes, so forming a plurality of intersections. The electrodes may also be arranged to display information in polar co-ordinate form or in any suitable set of curvilinear co-ordinates. By applying electric voltages to selected electrodes the liquid crystal material at their intersection is caused to change its optical property e.g. go from light scattering to clear or between transparent and opaque states, each area of intersection may be termed an element. Thus with suitable application of voltages at a plurality of intersections, elements can collectively display information, for example a waveform can be displayed. One method of applying the voltages is to use signals which differ from one another by a small phase difference and applying the same phase to a particular row and column electrodes with different phases elsewhere. In this method all intersections are 'on' except that one at the particular row and column. This is described in U.S. Pat. No. 4,127,848.

Another type of electro-optic display that can be addressed in matrix form is the a.c. electroluminescent display in which the application of a voltage across a doped phosphor layer causes light emission.

A problem common to matrix addressing is that the intersections not required to display information must receive voltages suitably different from the intersections required to show information. This problem is eased if the information required to be displayed is in the form of single valued trace e.g. a square waveform. In this case each row and column electrode can be addressed simultaneously with its appropriate waveform. However for a 128×128 element display this requires at least 128 different waveforms. In the invention described in U.S. Pat. No. 4,127,848 a master waveform is divided into 128 waveforms whose minimum phase difference is 2$\lambda$/128. Alternatively a poly frequency (e.g. 128 different frequencies) or poly-pulse width (e.g. 128 different pulse widths) may be used. The complexity of electronics for such a number of waveforms is considerable.

As used herein a matrix display is defined as a display having a set of n electrodes and a set of m electrodes forming n×m intersections or elements whereby information to be displayed is obtained by altering the optical property of the display at a desired number of intersections, the optical property being achieved by application of appropriate voltage waveforms to the two sets of electrodes.

As used herein a threshold voltage is that voltage above which a desired observable optical effect occurs, e.g. liquid crystal becomes clear from a scattering state or transparent from an opaque state or vice versa.

According to this invention a method of addressing a matrix display comprises the steps of generating a series of coded waveforms of different shapes, and applying the waveforms to two sets of electrodes so that, except where the same waveform occurs at particular electrodes, the minimum RMS difference between non-identical waveforms is greater than a display threshold value.

The waveforms may be of period T divided into N bits, each bit having a logical value of zero or one thus giving $2^N$ possible different waveforms. Alternatively, the period T may be divided into L bits and $2^N$ waveforms (L>N) out of a possible $2^L$ waveforms used. A logic level "1" may correspond to a voltage $V_1$ and a logic level "0" to a voltage $V_2$.

According to this invention apparatus for displaying waveforms comprises an electro-optic display having a first and a second set of electrodes arranged in a matrix form, means for generating a plurality of waveforms of different shapes over a period t, means for applying a different waveform from the plurality of waveforms to each electrode in the first set of electrodes, means for sampling at input signal to be displayed and producing a waveform signal representative of the amplitude of each sample, each waveform signal being substantially the same shape as a corresponding one of the plurality of waveforms, means for storing the form of the waveform signals, and means for applying the waveform signals to the second set of electrodes contemporaneously with the plurality of waveforms being applied to the first set of electrodes whereby the input signal is displayed at a plurality of electrode intersections where the rms voltage difference is zero or substantially below a threshold value, and elsewhere is above the threshold value, the waveforms applied across each electrode intersection being arranged to have an alternating current value.

The means for generating a plurality of waveforms may be a programmed memory e.g. a read only memory (ROM) a pseudo-random number generator or a binary code generator such as a binary counter whose outputs in the form of logic zeros and ones form different waveforms for each binary number generated, other forms of 2 level coding are possible.

The means for sampling an input signal may include a low pass filter, a charge coupled device (CCD) whose filtered output is fed via a sample and hold circuit or directly into an analog to digital converter (A/D converter). The input signal may be read into the CCD (used as an analogue shift register) at a high rate, until the CCD is full, and read out at a slower rate compatible with standard low power low speed A/D converters.

Buffer stores may be incorporated between the A/D converter and the means for storing the waveform signals so that low frequency input signals (which are sampled at low rates) may be stored while a previously stored signal is being displayed using the display memory. To obtain a Y shift to a displayed waveform an offset voltage may be applied to the A/D converter or by adding or subtracting a digital number to the output of the A/D converter. A Y-expansion (or contraction) may be obtained by applying a variable gain (or contraction) amplifier before the A/D converter or by altering the full scale reference level of the A/D converter.

An X-shift or expansion/contraction may be obtained by logic circuits which alters the start or sequence of the read-out of the memory used to define the signals to the second set of electrodes.

The electro-optic matrix display may be a liquid crystal display, an a.c. electroluminescent display, or a plasma arc display. The liquid crystal display may use the so-called twisted nematic or Schadt & Helfrich cell in which a thin e.g. 12 μm thick, layer of nematic liquid crystal material is contained between two glass plates unidirectionally rubbed to align liquid crystal molecules and arranged with the rubbing directions orthogonal. This results in a twisted molecular structure which rotates plane polarized light whose E vector lies parallel or perpendicular to the optical axis of the liquid crystal at the surface of the cell in the absence of an electric field and when a voltage (preferably a.c. 15 Hz–100 kHz) above a threshold, typically 1 volt for a 12 μm thick layer, is applied ceases to rotate plane polarized light. The cell is placed between polarizers with their optical axes parallel or crossed so that light transmission or extinction is obtained by switching the voltage on or off. Small amounts e.g. 1% of a cholesteric material may be added to the liquid crystal material, also small amounts of a dichroic dye may be added. Alternatively the liquid crystal display may operate using the cholesteric to nematic phase change effect in which a thin, e.g. 12 μm thick, layer of a cholesteric material changes from its light scattering cholesteric 'off' state to a nematic light transmissive 'on' state on application of a voltage above a threshold value e.g. 5 volts for a 10 μm thick layer containing E8+6% of CB15 (BDH Ltd. of Poole, Dorset). Dichroic dye may be added to the liquid crystal material to enhance contrast between the two states.

A liquid crystal cell responds to the RMS value (rather than the instantaneous value) of a waveform providing the period is shorter than the sum of the cell turn on and turn off time. If the waveform period is longer the liquid crystal can turn on and off within one waveform period. For a twisted nematic cell this typically means that the waveform frequency is greater than 25 Hz.

When a twisted nematic liquid crystal display is used the polarizers may be colored differently in different parts of the display. For example the polarizer may be in strips of different colours each strip being in register with a strip electrode. Such polarizers may be as described in U.K. Patent Application Ser. No. 52,123/74, U.S. Pat. No. 636,786, now abandoned and in which a thin layer of stretched microporous polypropylene material e.g. Celgard (Trade Mark) has incorporated therein a liquid crystal material and dichroic dye mixture. The liquid crystal may be incorporated by e.g. a silk screen printing process, on selected areas of Celgard layer. When different electrodes are associated with different colors e.g. alternate red and green stripes, dual trace displays are more readily observed since they are differently colored.

The input signal to be displayed may be e.g. a sine wave or other continuous or piecewise continuous function. Alternatively it may be a disocontinuous function as for example when it is required to illustrate signal levels from a plurality of sensors e.g. temperature or strain gauges. Each sensor output may have a specific position along the X-axis of a display and the sensor output value along the Y-axis. This may be arranged so that when all sensor outputs are at their correct value the display is all along the one horizontal line i.e. the error between desired and measured sensor outputs is displayed. Furthermore different colored areas of the display may be associated with desired operating ranges so that if an error signal is displayed it will be colored green if within certain limits, amber between this range and other limits and red if it lies outside both these ranges.

The invention will now be described, by way of example only, with reference to the accompanying drawings of which.

Figure 1:
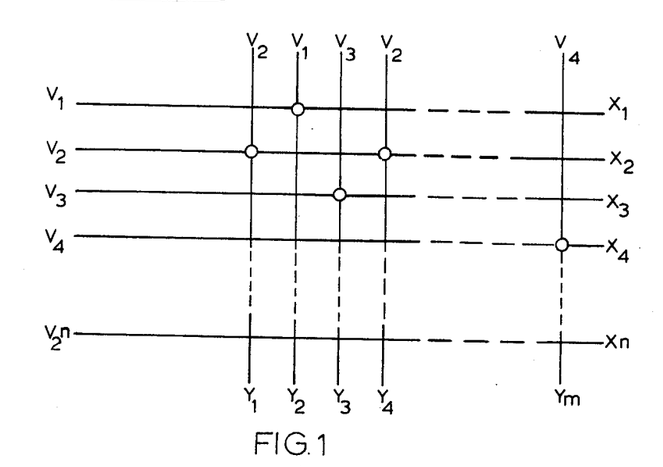
FIG. 1 is a diagrammatic view of a matrix display.

FIG. 1 shows in diagrammatic form a matrix display arranged in cartesian co-ordinates. It has $X_1$ to $X_n$ row electrodes and $Y_1$ to $Y_m$ column electrodes. Voltages V are applied to each X and Y electrode. If the display is a phase change liquid crystal display then information to be displayed, at the circled X-Y intersections, is obtained by applying zero volts at the circled intersections. Elsewhere the voltage is arranged to be above a threshold value. Similarly when the display operated with a twisted nematic or dynamic scattering type cell zero voltage is applied at the circled X-Y intersection and above threshold voltage elsewhere.

As an example n=m=128 i.e. a 128×128 element display. This requires 128 different waveforms V. Let the waveforms have a common period T divided into N bits with each bit having a logic zero volts or logic one of +V volts amplitude. This gives $2^N$ possible waveforms. The minimum RMS voltage difference between two different waveforms $V_i$ and $V_j$ lies in the range $$\frac{V}{\sqrt{N}} \leq (V_i - V_j)_{RMS} \leq V \quad i \neq j$$

Thus if N=7 then 128 waveforms are obtained and $$\frac{V}{\sqrt{7}} \leq (V_i - V_j)_{RMS} \leq V \quad i \neq j$$

when i=j $(V_i - V_j)_{RMS}=0$

For the example of FIG. 1 with N=128, $V_1$, $V_2$ ... $V_{128}$ are applied to the $X_1$, $X_2$ ... $X_{128}$ electrodes and voltages $V_2$, $V_1$, $V_3$, $V_2$, $V_4$ applied to electrodes $Y_1$, $Y_2$, $Y_3$, $Y_4$, $Y_{128}$ respectively. This gives zero volts RMS at intersections $X_2Y_1$, $X_1Y_2$, $X_3Y_3$, $X_2Y_4$, $X_4Y_{128}$ but $\geq V/\sqrt{7}$ volts at all other intersections. For a twisted nematic cell threshold voltage $V_c$ is typically about 1 volts (for a 12 μm thick layer) so that a maximum drive voltage of about 5 volts can be used giving a minimum voltage difference at non-selected elements of $2\frac{1}{2}$ volts i.e. $V/\sqrt{7} \simeq 2\frac{1}{2}V_c$. A 5 volt drive is well within the capbilities of CMOS or TTL semiconductor drive circuits.

Other waveforms for FIG. 1 are possible. For example if a waveform of period T is divided into L bits (L>N), with each bit capable of assuming a logic zero or one then $2^L$ waveforms are possible. If $2^N$ waveforms are required then $2^N$ waveforms from the $2^L$ possible waveforms are chosen so that each of the $2^N$ waveforms is at least p bits different from the other $2^N-1$ waveforms. These $2^N$ waveforms are used as described above but the minimum RMS voltage between waveforms $V_i$ and $V_j$ are $$V\sqrt{\frac{p}{L}} \leq (V_i - V_j)_{RMS} \leq V \quad i \neq j$$

when i=j then $(V_i-V_j)_{RMS}=0$
when L=8, N=7, p=2 the above minimum difference becomes $$(V/2) \leq (V_i-V_j)_{RMS} \leq V \quad i \neq j$$

Thus, where $2^N$ out of $2^L$ waveforms are used instead of $2^N$ out of $2^N$ total waveforms, the minimum voltage between two different waveforms is V/2 instead of $V/\sqrt{7}$ (for L=8, N=7). Other choices of L, N and p may give higher values for $\sqrt{p/L}$. This means that for a fixed threshold value $V_c$, V can be reduced.

Other values of L, N, and p can give other systems as described for binary coded numbers by the mathematics of error correcting codes where the bit difference p is known as the Hamming difference; see for example Peterson W. W. and Weldon E. J. Jnr., Error Correcting Codes, 2nd Edition, M.I.T. Press, 1972.

Figure 3:
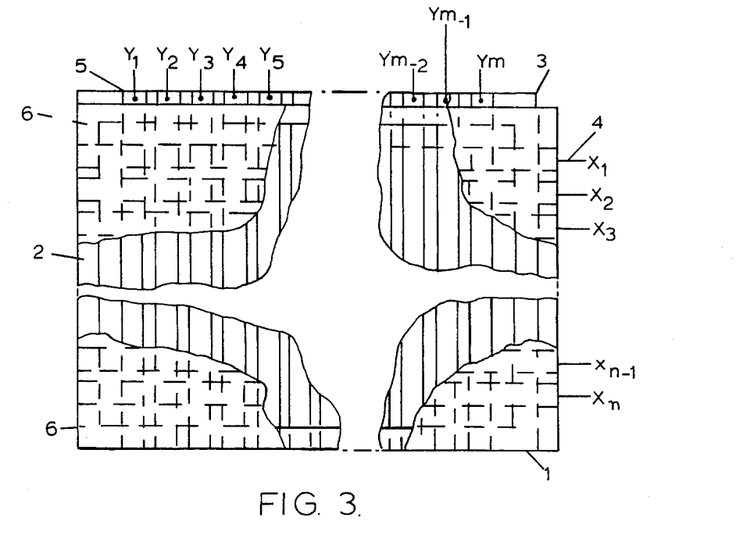
FIG. 3 is a view of a liquid crystal display.
Figure 4:
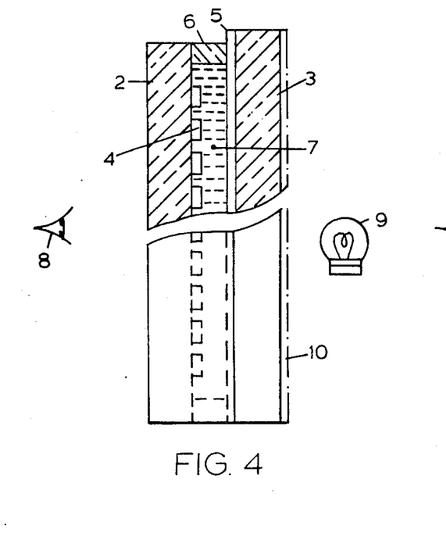
FIG. 4 is a cross-sectional view of FIG. 3.

FIGS. 3 and 4 show a liquid crystal display 1 having a $2^N \times 2^N$ element display. It comprises two glass plates 2, 3 carrying spaced strip electrodes 4, 5 arranged in an X Y matrix form. These strips 4, 5 are of tin oxide typically $\sim 10^4$ Å thick (resistivity $\approx$ 1-1000 Ω/□), 600 μm wide and spaced 50 μm apart. To obtain the strips 4, 5, the plates 2, 3 are coated with tin oxide e.g. by sputtering and then etched through photolithographic or screen printed masks in a conventional manner. A spacer ring 6 maintains the plates 2, 3 about 12 μm apart, an epoxy resin glue fixes the plates 2, 3 and spacer 6 together. Between the plates 2, 3 is a cholesteric liquid crystal material 7 incorporating a dichroic dye. Suitable materials are: E8 (nematic) with about 6% CB 15 (cholesteric) and one or more of the following dyes:

The display may be observed 8 by light transmission using natural fluorescent or an electric light 9 behind the display or by projecting an image of the display 1 onto a magnifying lens or mirror or a reflecting screen.

Alternatively a reflector 10 may be placed against the outer surface of plate 3 (or the surface silvered) and the display observed by reflected light.

Threshold voltage is about 5 volts and thus with an applied voltage of 18 Volts, $(V_i-V_j)_{RMS}$ is typically greater than about 9 volts and with zero volts applied across an X-Y intersection that intersection is light scattering and appears colored because of the dye. With the voltage greater than about 9 volts RMS across an intersection that intersection appears clear or the color of a back light or reflector.

Figure 2:
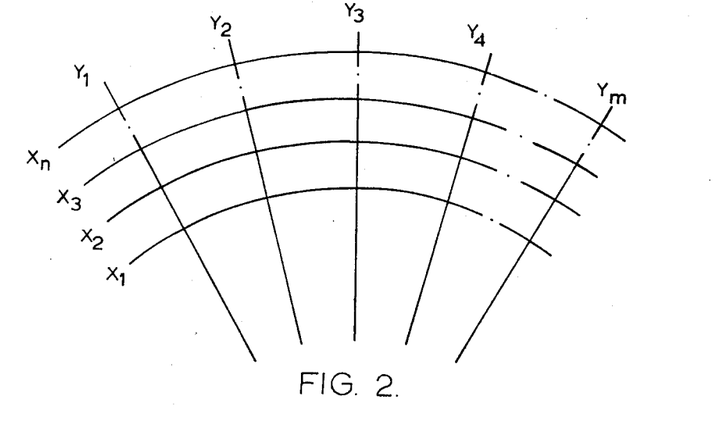
FIG. 2 is a diagrammatic view of a polar co-ordinate display.

The display of FIGS. 2, 3 may also use a nematic E8 or nematic E8 and 6% CB 15 cholesteric mixture as a twisted nematic cell.

To obtain a twisted cell the plates are unidirectionally rubbed with tissue paper prior to assembly then assembled with the rubbing directions orthogonal. Polarizers are arranged either side the cell with their optical axis parallel or perpendicular to the rubbed direction. Alternatively the plates may have magnesium fluoride or silicon monoxide deposited by a technique known as oblique evaporation with an angle of incidence of an evaporating beam to the plates of between 45° and 90° as described in U.K. Pat. No. 1,454,296.

FIG. 2 shows in diagrammatic form a matrix display arranged in polar co-ordinate form with the Y-electrodes arranged radially and X-electrodes arranged in a curved form. Construction and operation of the device of FIG. 2 is otherwise similar to that of FIGS. 1, 3, 4.

Figure 5:
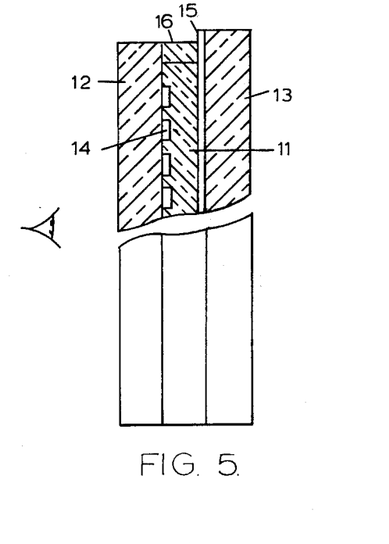
FIG. 5 is a cross-sectional view of an a.c. electroluminescent display.

The a.c. electroluminescent display of FIG. 5 comprises a layer 11 of electroluminescent phosphor material contained between glass plates 12, 13 bearing strip electrodes 14, 15. A glass ring 16 encloses the layer 11 and spaces the plates 12, 13 the desired distance apart. The phosphor material 11 may be obtained in a known manner as follows: an admixture is formed of particles of a compound or compounds of an element of group IIb with an element of group VIb (e.g. zinc sulphide) and an activate such as copper and a co-activator such as chlorine. These particles are then embedded in a translucent binding matrix (e.g. polymethylmethacrylate) to form a layer.

Figure 6:
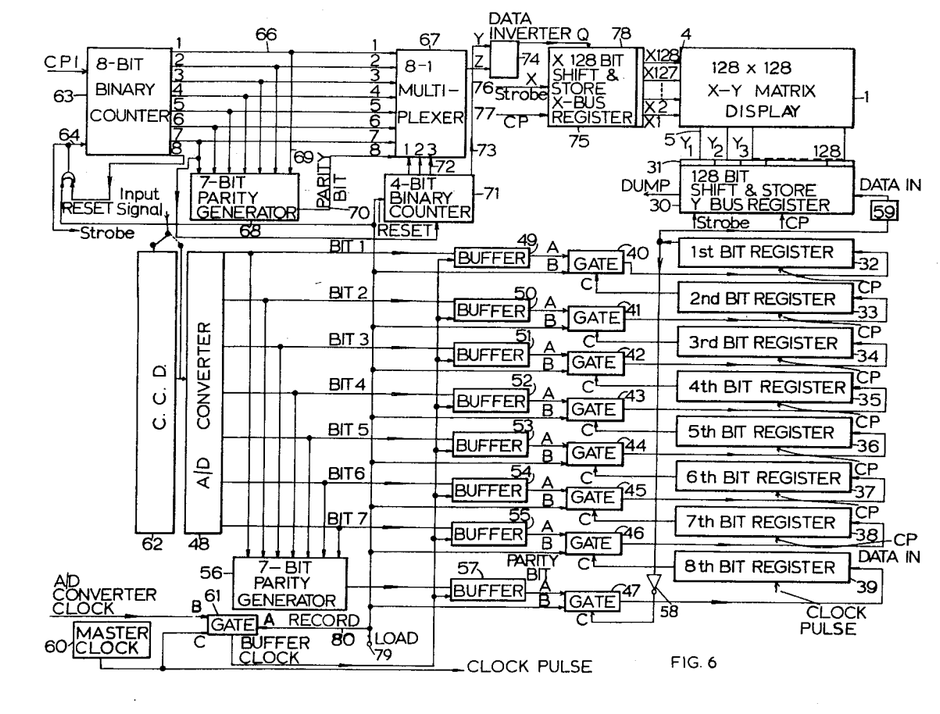
FIG. 6 is a block diagram showing the display and drive voltage circuits for a 128×128 element display.

FIG. 6 shows a 128×128 element XY matrix display. The display comprises the liquid crystal display 1 of FIGS. 3, 4 having X-row electrodes 4 and Y column electrodes 5.

A 128 bit shift and store Y-bus register 30 has its 128 latchable bistable outputs 31 connected to a Y-electrode 5. Input to the Y bus register is serially from one of eight 128 bit serial shift registers 32 to 39 connected in series through gates 40 to 47. Seven of these registers 32 to 39 have an input from the output of a seven bit analogue to digital (A/D) converter 48 through seven buffer stores 49 to 55 and the gates 40 to 46. Thus collectively the seven registers 32 to 38 can hold 128 7 bit words in binary form. Each A/D converter output is connected to a 7 bit parity generator 56 whose output is connected through a buffer store 57, and the gate 47 to the input of the eighthbit register 39. An inverter 58 is connected between the output of the first bit and eighth register 32, 39 respectively. A circuit 59 is connected between the first-bit register 32 and the Y bus register 30. Clock pulses C.P. are applied to all the registers 32 to 39 and Y-bus register 30 from a master clock 60. The A/D converter 48 may be supplied directly with incoming signals or via a charge coupled device (CCD) 62 which can receive the incoming signal at higher rates than the A/D converter 48.

Waveforms for applying to the X-electrode 4 are generated by an 8-bit binary counter 63 which has a reset input 64, a clock pulse input 65 and eight outputs 66 which collectively provide binary numbers i.e. each output can be either a logic zero or one. Seven outputs (the least significant) from the counter 63 are connected to an eight channel input/single channel output multiplexer 67. The most significant, eighth, bit of the counter 63 output is connected through an OR gate to the counter reset 64 and to all strobe inputs. A 7-bit parity generator circuit 68 has seven inputs 69, one connected to each of the seven least significant counter outputs 66. Output 70 from the parity circuit 68 is to the eighth input channel of the multiplexer 67. A 4-bit binary counter 71 has four outputs 72, 73 which collectively provide binary numbers. The least significant three outputs 72 connect to the multiplexer 67 whilst the most significant output 73 controls an inverter 74. Input to the 4-bit counter 71 is from the output of the seventh bit 66 of the 8-bit counter 63 and is arranged to clock the 4-bit counter 71 as the 8-bit counter resets. Output from the multiplexer 67 is through the switchable inverter 74 to the serial input of a 128-bit shift and store X-bus register 75. This X-bus register 75 has strobe 76 and clocking pulse 77 inputs and 128 latchable bistable outputs 78 one connected to each of the 128×electrodes 4.

A load terminal 79 is connected to all the register input gates 40 to 47, the 4-bit counter 71 reset and 8 bit counter reset 64.

The inverter 74 has the following logic; inputs are Y, Z, output is Q; $Q = Y.Z + Y.\bar{Z}$.

The gates 40 to 47 have the following logic: output $Q = A.B + \bar{A}.C$.

Operation of the display is as follows. Clock pulses are applied to the 8-bit counter 63 causing logic ones and zeros to appear at the eight outputs 66 in the following manner:

TABLE 1

| Parity bit | Counter output terminal | | | | | | | Clock pulse |
|---|---|---|---|---|---|---|---|---|
| | 7 | 6 | 5 | 4 | 3 | 2 | 1 | |
| 0 | 0 | 0 | 0 | 0 | 0 | 0 | 0 | 0 |
| 1 | 0 | 0 | 0 | 0 | 0 | 0 | 1 | 1 |
| 1 | 0 | 0 | 0 | 0 | 0 | 1 | 0 | 2 |
| 0 | 0 | 0 | 0 | 0 | 0 | 1 | 1 | 3 |
| 1 | 0 | 0 | 0 | 0 | 1 | 0 | 0 | 4 |
| 0 | 0 | 0 | 0 | 0 | 1 | 0 | 1 | 5 |
| 0 | 0 | 0 | 0 | 0 | 1 | 1 | 0 | 6 |
| 0 | 1 | 1 | 1 | 1 | 1 | 1 | 0 | 126 |
| 1 | 1 | 1 | 1 | 1 | 1 | 1 | 1 | 127 |
| 0 | 0 | 0 | 0 | 0 | 0 | 0 | 0 | 0 (or 128) |
| 1 | 0 | 0 | 0 | 0 | 0 | 0 | 1 | 1 |
| 1 | 0 | 0 | 0 | 0 | 0 | 1 | 0 | 2 |

The eight bit is a parity bit generated by the parity generator 68 to be described later.

At the start of clocking pulses, and after each reset, the 4-bit counter 71 is in its 0000 logic output state which commands the multiplexer 67 to connect the 1st bit output 66 of the 8-bit counter 63 through the inverter 74 to the X-bus register 75. Under the control of clocking pulses applied to the X-bus register 75 the output of the 1st bit of the 8-bit counter 63 for 128 clocking pulses applied to the 8-bit counter are placed serially in the X-bus register 75. This X-bus register 75 is now filled with logic ones and zeros in the order shown under terminal 1 output Column in Table 1 and when a strobe pulse is applied these ones and zeros are entered into the latchable bistable 78, a logic one or zero thus appears on each X-electrode 4. The strobe pulse is generated at the end of 128 clocking pulse applied to the 8-bit counter by the eighth bit output 66 of the 8-bit counter 63 changing to a logic one and pulsing the reset 64 thereby resetting the 8-bit counter 63 to its initial all zero outputs. Also at the end of the 128 clocking pulses the 4-bit counter is pulsed so that its output causes the multiplexer 67 to connect the 2nd bit output 66 of the 8-bit counter 63 to the X-bus register 75. The next 128 clocking pulses cause the logic ones and zeros, shown in Table 1 output terminal 2 column, to be shifted into the X bus register 75. When full a strobe pulse outputs these logic ones and zeros into the bistables 78 and hence the X electrodes 4. The 8-bit counter 63 is reset and the 4-bit counter 71 induces to its next number to connect the multiplexer to the 3rd bit output 66. This is repeated for seven fillings of the X-bus register 75. The next reset pulse connects the parity generator 68 through the multiplexer 67 to the X-bus register 75. As each further 128 clocking pulses are applied to the 8-bit counter 63 the parity generator 68 examines the first to seventh bit outputs of the 8-bit counter 63 and generates a logic one or zero to make the binary number appearing collectively at the first to seventh outputs 66 all have either an odd or an even number of ones when taken with the parity bit. This is shown in Table 1 where for each clock pulse there is an even number of ones or zeros in each line. The parity one or zero thus generated is fed serially into the X-base register 75.

A liquid crystal display must be driven by an a.c. voltage supply and therefore after one period of the 128 different waveforms i.e. after the last (the 128th) the parity bit has been generated the reset pulse applied to the 4-bit counter 71 causes its 4th bit output 73 to change the state of the inverter 74. This ensures that the next period of 128 different waveforms are of complementary logical form until the invertor 74 is again reset to its non-inverting state.

Figure 7:
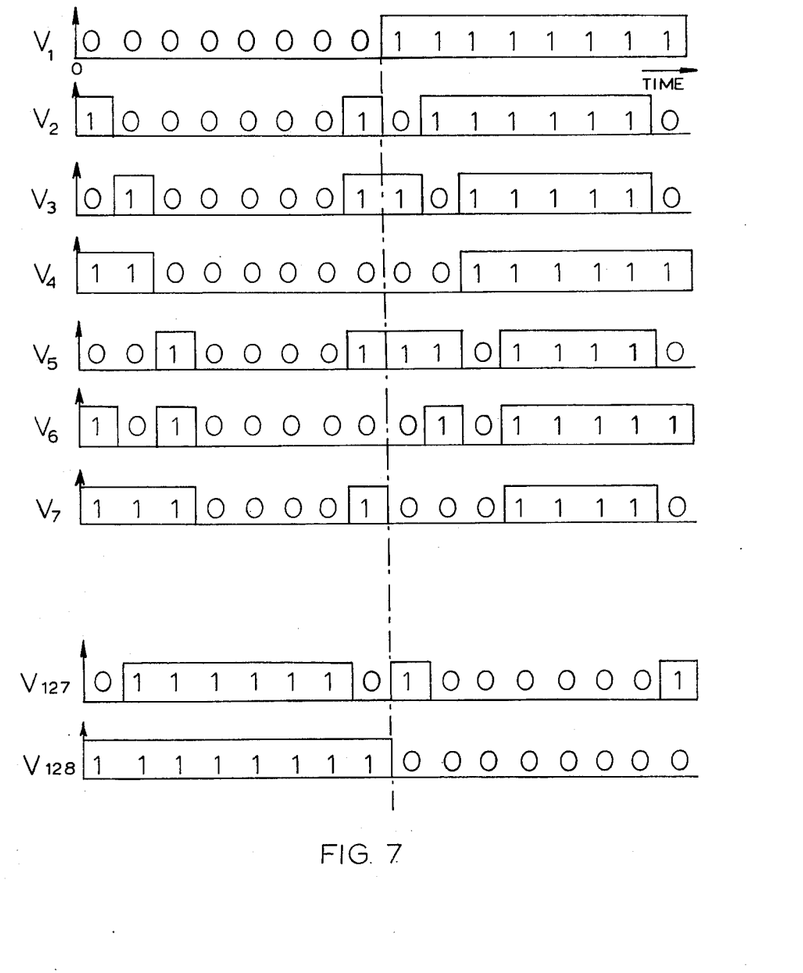
FIG. 7 shows waveforms for the display of FIG. 6.

The shape of the 128 waveforms simultaneously applied to all the X-electrodes is illustrated in FIG. 7 where voltage $V_1$, $V_2$ etc. shows the voltage waveform applied to X-electrode 1, 2, etc.

When it is required to display information along say $X_5$ electrode then a voltage waveform of $V_5$ must be applied to the appropriate Y-electrode. Since the X-voltage waveforms each represent a binary number which is sequentially different between each X-electrode an input signal waveform can be displayed in its correct position in a row of the display 1 by generating a binary number from the input signal waveform which binary number represents the height of the input waveform from a datum.

An input signal which may have been passed through an appropriate low pass filter, can be applied direct to the A/D converter 48, or for high frequency input signals to the charge coupled device 62. When applied to high frequency input signals to the charge coupled device 62 each sample of the input signal is converted into an appropriately sized charge packet and is clocked at one frequency beneath each clocking electrode until the charge coupled device is full; the input may then be disconnected and the contents of the charge coupled device 62 clocked out at another, lower, frequency into the A/D converter 48. A low pass filter (not shown) may be used to smoothe the output of the charge coupled device prior to the A/D converter. The A/D converter 48 samples the input signal waveform and produces a 7-bit binary number for each 128 samples in succession. Each of the 7-bits of the A/D converter 48 output is monitored by the parity generator 56 which produces a logic one or zero output into the parity bit buffer store 57. As previously described with reference to the other parity bit generator 68 it is necessary that each binary word, representing an input signal amplitude sample belongs to the family of numbers having an even number of ones. Alternatively both parity generators 56, 68 could be arranged to ensure an odd number of ones. These 8-bit numbers (7-bit words plus parity bit) are clocked into the 128-bit buffer stores 49 to 57. Use of a CCD 62, and buffer stores 49 to 57 in addition to the A/D converter 48 allows considerable flexibility in the nature of input signal to be display 1 since frequencies much higher than those capable of being processed by the A/D converter 48, or much lower than those compatible with the required period of the Y-electrode waveforms can be loaded into the buffer stores 49 to 57 and held until required then clocked out at an appropriate rate.

The contents of the buffer 49 to 57 are clocked through the gates 40 to 47, held open to input B by a load pulse 79, into the eight shift registers 32 to 39. When full these eight registers collectively contain 128 8-bit binary words or waveforms i.e. an 8-bit waveform for each of the 128 Y electrodes 5, the form of each 8-bit waveform represents the vertical position of information to be displayed and its position along the 128 bits of the register represents the horizontal position of information to be displayed. After filling the eight registers 32 to 39 the load pulse 79 is removed which connects the C input of the gates 40 to 47 to their output i.e. each register 32 to 39 is connected together serially. Thus after 128×8 clocking pulses have been applied to the eight register 32 to 39 the 128 8-bit words have returned to their initial position but inverted by passage through the inverter 58.

The contents of the eight registers 32 to 39 are fed to the Y-electrode 5 as follows. Clocking pulses are applied to the Y bus register 39 and all eight registers 32 to 39. After 128 clocking pulses the Y-bus register 30 contains the 1st bit of the 128 8-bit words and these 1st bits (logic ones and zeros) are placed into the bistable 31 by a strobe pulse applied to the Y-bus register 30. At this time the 1st bit register 32 now contains the 2nd bits of the 8-bit words whilst the 8th bit register 39 contains the 1st bits and so on with the other registers 33 to 38. A further 128 clocking pulses are applied to dump the contents of the Y bus register 30 and enter the 2nd bit of the 8-bit words in both the Y-bus register 30 and 8th register 39 from the 1st bit register 32. A strobe pulse enters the new information into the bistables 31 and a further 128 clocking pulses applied as before. This is repeated until all 8-bits have been applied to each Y-electrode 5 then the inverse applied to each Y-electrode 5. Since both X and Y-electrode have waveforms applied using synchronised clock waveforms zero voltage differences occur at intersections having identically shaped waveforms, and RMS voltages greater than threshold at all other intersections thereby collectively displaying the input signal waveform. The voltage level of the logic one is chosen as previously described to give a minimum $V_{RMS} > V_c$ and preferably $V_{RMS} \geq 2 V_c$ where $V_c$ is the liquid crystal threshold voltage.

As described above once 128 samples of an input waveform have been sampled the display 1 will continue to display the information until a fresh set of information is inserted into the registers 32 to 39 from the buffer store.

The logic processing circuit 59 may be used to alter the starting point of the information passed into the Y-bus register to give horizontal shift to a display signal or may alter the sequence of this information to stretch the displayed signal. For example every second bit from the 1st Bit register 32 may be loaded twice into the Y bus register to give a 2X horizontal expansion.

Typical values of frequencies used are:
master clock 15 kHz–1 MHz (30kHz typical)
register and counter clocking from master clock
Input signal frequency 0–10 MHz
A/D clock 10 kHz–10 MHz (8-bit conversion rate ~1 kHz–1 MHz) (20 μsec for an 8-bit conversion typical)
buffer clock A/D clock or master clock
CCD clock 5 kHz–50 MHz input; A/D converter clock output.

The circuit described with reference to FIG. 5 uses (to use earlier terminology) a waveform of period T divided into L bits with $2^N$ waveforms used, L being 8, and N being 7.

Figure 8:
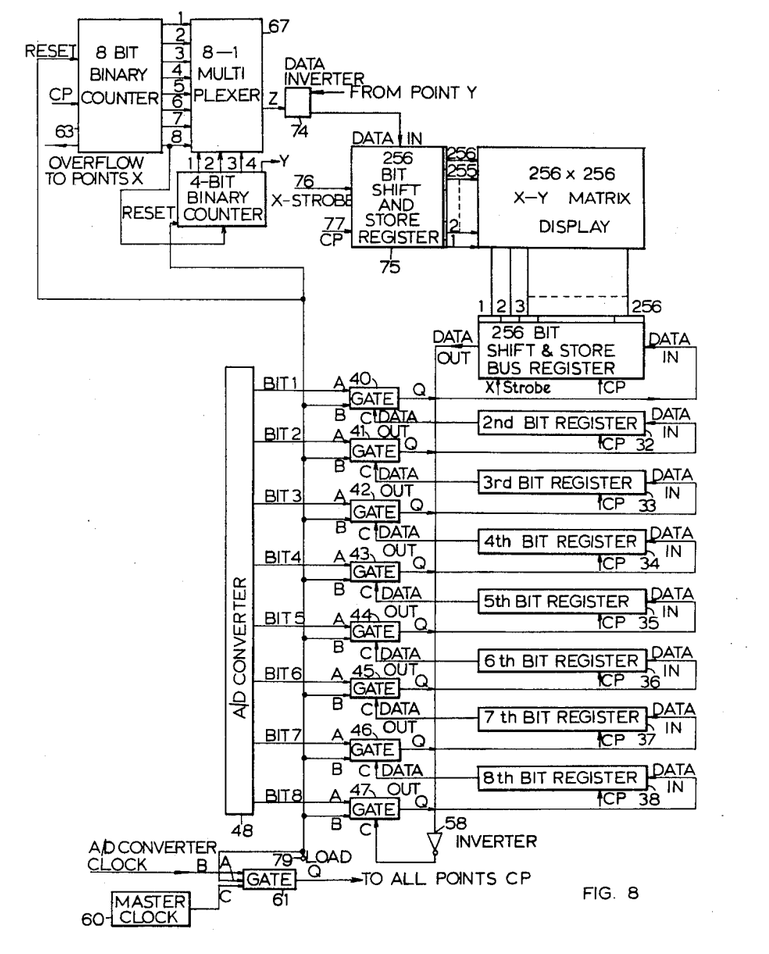
FIG. 8 is a block diagram similar to FIG. 6 but for a 256×256 element display.

In the modification shown in FIG. 8 waveform of period T is divided into N bits. Thus the circuit of FIG. 6 is modified by removing the parity generators 56, 68 and connecting the output of the 8th bit of the 8-bit counter 63 to the input to the 4-bit counter 71. Also the A/D converter 48 is changed to an 8-bit A/D converter 48[1]. The liquid crystal display 1 has 256 X and Y electrodes with a consequential increase to 256 bits in the various registers. Operation is similar to that of FIG. 5 with like components having the same reference numerals.

Alternatively this 256×256 element display could be altered to a 128×128 display.

The shift registers 32 to 39 may be replaced by random access memories (RAM). An electrically alterable read only memory (EAROM) may be used as a semi-permanent passive store and the display used for waveform matching by deaf persons.

The display may be used in conjunction with computers, correlators, spectrum analyzers, and as a radar display or as an artificial horizon display.

One disadvantage of using the binary waveforms as described above is that $(V_1 - V_j)_{RMS}$ varies by an amount which can give rise to objectionable patterns in the background of the display when for example a twisted nematic cell display is viewed at an angle well away from the normal to the display. The reason for this pattern is that even above the value of electric field which saturates the transmission of the cell at normal incidence the liquid crystal molecular alignment is dependent on voltage and transmission variations may be seen when the cell is viewed at an angle.

To avoid this effect pseudo-random binary number waveforms can be used. These have the property that $(V_i-V_j)_{RMS}$=constant (when $i\neq j$).

Thus for a 126×128 matrix display 126 different pseudo random waveforms are applied continuously to the X-electrodes whilst appropriate waveforms out of the 126 different waveforms are applied to the Y-electrodes.

Pseudo random binary number waveforms may be generated as follows. If a 3-bit register with modulo-two feedback from its first and third outputs (i.e. its first and third stage outputs are connected to an exclusive 'or' gate whose output is fed back into the shift register) then the stages of the register will show the following states as it is clocked from a starting point of content 001.

TABLE 2

| Clock Pulse Number | Bit 1 | Bit 2 | Bit 3 |
|---|---|---|---|
| 0 | 0 | 0 | 1 |
| 1 | 1 | 0 | 0 |
| 2 | 1 | 1 | 0 |
| 3 | 1 | 1 | 1 |
| 4 | 0 | 1 | 1 |
| 5 | 1 | 0 | 1 |
| 6 | 0 | 1 | 0 |
| (7) | 0 | 0 | 1 |

The binary number constituted by bits 1 to 3 jumps randomly within its possible range until on clock pulse 7 the sequence starts to repeat. The bit 1 output consists of a random sequence of "1" and "0" states until it starts to repeat itself on clock pulse 7. This is also referred to as an M-sequence (M for maximum) by mathematicians. If bit 3 is connected into a further 4-bit shift register which is clocked synchronously with the first register then 7 outputs in all are obtained. These give the following binary waveforms:

TABLE 3

| Register Output Number | Clock Pulse Number | | | | | | | | | |
|---|---|---|---|---|---|---|---|---|---|---|
|  | 0 | 1 | 2 | 3 | 4 | 5 | 6 | 7 | 8 | 9 |
| 1 | 0 | 1 | 1 | 1 | 0 | 1 | 0 | 0 | 1 | 1 ... |
| 2 | 0 | 0 | 1 | 1 | 1 | 0 | 1 | 0 | 0 | 1 ... |
| 3 | 1 | 0 | 0 | 1 | 1 | 1 | 0 | 1 | 0 | 0 ... |
| 4 | 0 | 1 | 0 | 0 | 1 | 1 | 1 | 0 | 1 | 0 ... |
| 5 | 1 | 0 | 1 | 0 | 0 | 1 | 1 | 1 | 0 | 1 ... |
| 6 | 1 | 1 | 0 | 1 | 0 | 0 | 1 | 1 | 1 | 0 ... |
| 7 | 1 | 1 | 1 | 0 | 1 | 0 | 0 | 1 | 1 | 1 ... |

Note that each output is delayed by one clock pulse from the previous one and that the voltage different ($0-0\equiv 0$ volts; $1-0\equiv -V$; $1-1\equiv 0$ volts) between any two outputs is net a.c. over every seven bits and has an RMS value of $V\sqrt{4/7}$. Thus to make an oscilloscope display with only seven rows, rows 1 to 7 respectively could be connected to outputs 1 to 7 of the composite shift register. Successive digitized signal samples could then be used to determine the correct pseudo-random waveform to be applied to the successive column electrodes of the display. This would give one 'off' element (zero voltage difference) in each column and six 'on' elements with an a.c. voltage difference of $V\sqrt{4/7}$ RMS. The method can be extended to an N-bit shift register with modulo-two feedback from bit 1 and bit N. If this is cascaded into a second register having $2^N-(N+1)$ outputs, $2^N-1$ outputs in all are obtained, each of which gives a different pseudo-random wave-form which lasts for $2^N-1$ bits before repeating itself and which has $2^{(N-1)}-1$ '0' bits and $2^{(N-1)}$ '1' bits.

The voltage difference between any two such waveforms is always a.c. and given by $$(V_i - V_j)_{RMS} = V\sqrt{\frac{2^{N-1}}{2^N - 1}}$$

Note that $(V_i-V_j)_{RMS}\rightarrow(V/\sqrt{2})$ as $N\rightarrow\infty$

Figure 9:
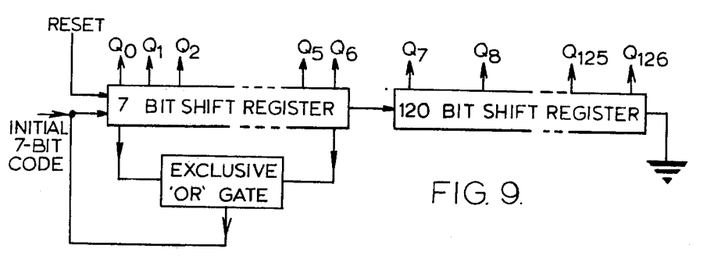
FIG. 9 shows a 7-bit shift register with exlcusive 'OR' feedback for generating a pseudo random code.

For example FIG. 9 shows a 7-bit shift register 90 having its first and seventh outputs connected to an exclusive 'OR' gate whose output is connected to the input of the 7-bit register. Output from the 7-bit register is to a 120-bit shift register 91. There are a total of 127 outputs (one from each stage of the registers 90, 91). The starting point for the pseudo random code generated will depend on the initial set of zeros and ones in the 7-bit register. Thus any one of $2^N-1$ starting points can be provided by correct initial loading of the 7-bit register.

Thus in the practical example of a display having 126 row electrodes the 7-bit and 120 bit shift register of FIG. 9 could be used and outputs 1 to 126 could be connected to the appropriate row electrode. Output 127 would be left spare to allow the trace to be removed from the display if necessary and the waveforms appropriate to the signal samples would be applied to the columns. In this case $$(V_i - V_j)_{RMS} = V\sqrt{\frac{64}{127}} = 0.71 V.$$

Having obtained waveforms for applying to row electrodes there remains the problem of relating a waveform to be displayed with the pseudo random waveforms. In the embodiments of FIG. 6 the binary codes or waveforms applied to the rows were successive binary numbers. A waveform to be displayed was sampled and the amplitude of each sample given a corresponding binary number. This, when applied to a column electrode caused a zero voltage on the matrix display at a point whose position along the column represented the amplitude value of the sample.

With pseudo random waveforms the binary number at the start of each code is random. For example examination of the register stages for the first three clock pulses, table 3, shows outputs 001, 010, to 111 but not in successive stages. It is possible to connect the register stages so that successive rows in a display have successive starting binary codes and then amplitude samples of a waveform to be displayed may be used directly as binary numbers to prime the pseudo random code generator supplying column waveforms.

A more attractive alternative, bearing in mind the large number of random interconnections which the foregoing would entail between the row shift register and the row electrodes, is to translate the signal samples (e.g. the binary outputs of the A/D converter 48 FIG. 6) into the appropriate pseudo-random binary number to start the correct column waveform. This could be accomplished using a read only memory (ROM) addressed by the signal sample and pre-programmed to output the appropriate binary number corresponding to each address. This number is then loaded into the appropriate column shift register and used to start the column waveform at the correct point. The number binary zero can now be dealt with by programming address 'zero' on the ROM to output the same number as that used to start the unused waveform which allows the trace to be removed from the display. This latter method is the one described later with reference to FIG. 10.

Figure 10:
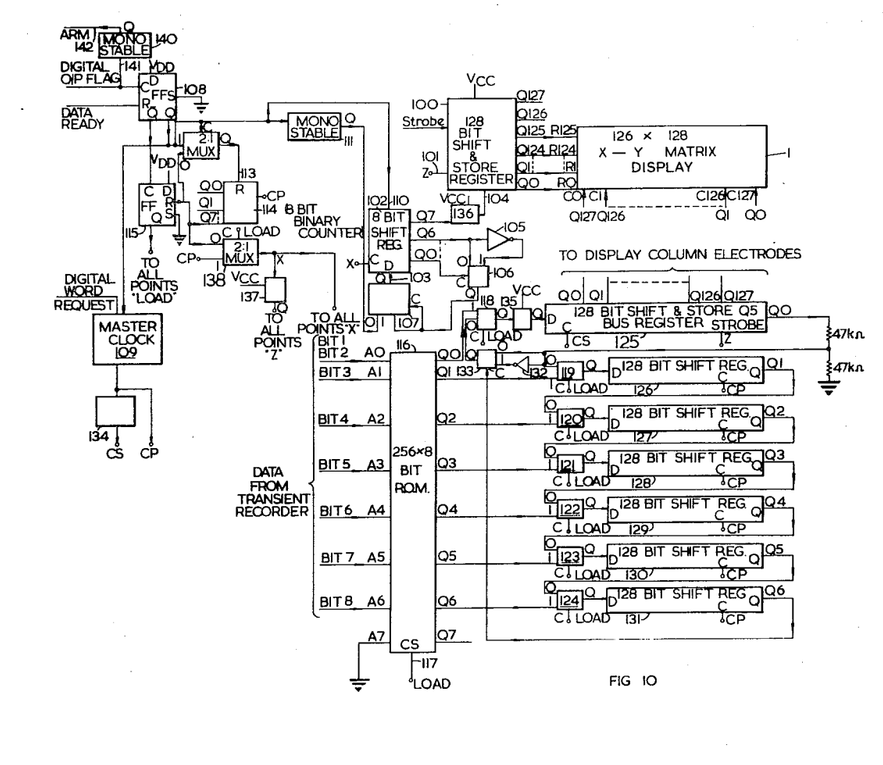
FIG. 10 is a block diagram showing circuits for applying a pseudo-random waveform to a 126×128 element display.

FIG. 10 shows a 126 row by 128 column display and circuitry for supplying binary pseudo-random codes to the rows and columns. The circuit may be supplied with digitized information from the A/D converter 48 of FIG. 6 or from a transient recorder itself supplied with a waveform signal to be displayed. Such a recorder may be of standard type e.g. Datalab DL 905 (from Data Laboratories Ltd., Mitcham, Surrey) which provides the functions of input gain control, coupling and Y-shift, analogue to digital conversion, timebase clock generation, trigger and arming circuits, and a digital memory.

As shown the matrix display 1, constructed as shown in FIGS. 3, 4, has 126 row X electrodes $R_0, R_1, \ldots R_{125}$ and 128 column Y-electrodes, $C_0, C_1 \ldots C_{127}$.

The circuit for supplying row waveforms comprises a 128 bit serial—in/parallel—out shift and store X-bus register 100 having outputs $Q_0, Q_1, \ldots Q_{125}$ connected respectively to rows $R_0, R_1 \ldots R_{125}$; outputs $Q_{126}, Q_{127}$ are unused. Clocking pulses are applied to clocking input 101 Z. A strobe input is tied high e.g. to Z, so the store contents pass into the row $R_0$ to $R_{125}$. Input to the X-register 100 is from an 8-bit shift register 102 having a serial input 103 and parallel outputs $Q_0, Q_1, \ldots Q_7$. Output $Q_7$ connects to the X-register 100 input 104 whilst outputs $Q_0, Q_6$ are connected together via an exclusive 'OR' gate, formed by an inverter 105, and 2:1 multiplexer 106, and an 'OR' gate formed by multiplexer 107 to the 8-bit register serial input 103. Clocking pulses are applicable to a clock input, X. A first flip flop 108 has inputs C, R and outputs Q, $\overline{Q}$. Output Q connects with a master clock 109, a reset terminal 110 to the 8-bit register 102, and a monostable 111 which itself connects through a 2:1 multiplexer 112 to the reset terminal 113 of an 8-bit binary counter 114 having parallel outputs $Q_0, \ldots Q_7$. A second flip flop 115 has inputs C, R and an output Q which provides a load pulse signal. Input C is connected to $\overline{Q}$ of the first flip flop 108 and input R connects with the output $Q_7$ of the 8-bit counter 114 and an 'OR' gate formed by a 2:1 multiplexer 138. Clock pulses cp are also applicable to this multiplexer 138.

The circuit for supplying column waveforms comprises a 256×8 bit read only memory (ROM) 116 having eight inputs $A_0, A_1, \ldots A_7$ and eight outputs $Q_0, Q_1, \ldots Q_7$ and a clocking terminal 117. Input $A_7$ and output $Q_7$ are unused and the remaining inputs are connected so that the least significant bit of the 8-bit output of the transient recorder (not shown) output is left unconnected. Each ROM output $Q_0, Q_1 \ldots Q_6$ is respectively connected through 2:1 multiplexers 118, 119, 120, 121, 122, 123, 124 to 128 bit serial-in/serial-out shift registers 125, 126, 127, 128, 129, 130, 131; the register 125 being a Y shift and store bus register with 128 parallel outputs $Q_0, Q_1, \ldots Q_{127}$ which connect respectively with the column and electrodes $C_0, C_1, \ldots C_{127}$. Each register 125 to 131 is connected head to tail through the multiplexers 118 to 124. Also the output of the Y-register 125 is connected with the output of the 7th bit register 131 via an exclusive 'OR' gate, formed by an inverter 132 and 2:1 multiplexer 133, and an 'OR' gate formed by the multiplexer 118 to the Y register input.

Since the display may need different operating voltages from the rest of the circuitry level change circuits 134, 135, 136, 137 are arranged to provide the correct operating voltage.

The 2:1 multiplexers have the following logic: with zero volts applied to C input 0 is connected to output Q; with suitable volts applied to C input 1 is connected to output Q.

In operation waveforms for application to the row electrodes of the display are generated as follows.

A pulse is applied to input C of the first flip flop 108 causing its output Q to go to a high value: this applies a reset pulse to the counter 114 and the 8-bit register 102, stops the master clock 109, and triggers the monostable 111 causing it to emit a pulse greater than the master clock period $\tau_c$ but less than six times $\tau_c$. After an interval (determined by the transient recorder e.g. $\sim 1$ $\mu$sec) a pulse is applied to input R of the first flip flop 108 which causes its output $\overline{Q}$ to go high as Q goes low. The output $\overline{Q}$ causes the second flip flop 115 output to go high causing a load pulse to be applied to all points marked 'load'. As Q of 108 goes low the master clock 109 is restarted and the reset pulse removed from the counter 114 and 8-bit shift register 102.

Clock pulses are also applied to the 8-bit register 102, and Y-register 100. On the first clock pulse the monostable's 111 output pulse applies, through the 'OR' gate formed by the multiplexer 107, a logic one to the input 103 of the 8-bit register 102. Successive clock pulses move this logic one along towards the $Q_7$ stage whilst logic ones are also loaded into the input 103 from the monostable 111 pulse until it drops to zero then from the exclusive 'OR' gate 105, 106. This exclusive 'OR' gate 105, 106 applies a logic one until the initially entered logic one reaches $Q_7$ when the exclusive 'OR' gate 105, 106 emits a logic zero into input 103. The 8-bit register 102 thereafter continues to generate, due to the exclusive 'OR' gate 105, 106 feedback, the remainder of, a 127-bit pseudo random sequence. Meanwhile as the initial logic one is shifted along the 8-bit register 102 its $Q_7$ output, initially zeros (since the register 102 was reset to all zero), is clocked along the X-register 100. As a result the pseudo random codes generated by the 8-bit register 102 enter the X-register and appear as 126 different codes on outputs $Q_0$ to $Q_{125}$ of the X-register 100. After 128 clock pulses from the master clock 109 the 8-bit counter 114 output $Q_7$ emits a pulse to the second flip flop 115 causing the load signal to drop to zero. Thereafter the 8-bit register 102 and X-register 100 have clock pulses applied from the counter 114 output $Q_7$ via the multiplexer 138 i.e. at frequency $f' = 1/128$th the master clock frequency f. The pseudo random codes are applied to each row electrode $R_0$ to $R_{125}$ of the display until the first flip flop 108 has a pulse applied to its C input when the above process repeats itself.

Whilst the pseudo random codes are being generated and applied as described above pseudo random codes are being generated for application to the column electrodes as follows.

Details of a sampled waveform to be displayed are applied to the ROM 116 as a succession of 7-bit binary words, representing the amplitude value of each successive sample. Those words are applied when the second flip flop 115 emits a load pulse to the ROM 116 and to each multiplexer 118 to 124 and each word is loaded in by clocking pulses from the master clock 109 to the transient recorder via the digital word request terminal. The ROM 116 outputs a predetermined 7-bit word for each value of binary number applied to its input; the relation between the ROM input and output is described later and in table 4. The ROM 116 outputs $Q_0$ to $Q_6$ are respectively shifted into register 125 to 131 until 128 words from the transient recorder have been converted into 128 7-bit binary codes collectively held in the registers 125 to 131. The load pulse of the second flip flop 115 then drops to zero and no further information is fed into the (full) registers 125 to 131. These 128 7-bit binary codes each form the starting point of pseudo random codes about to be generated. For example the first bit in each register 125 to 131 (a total of 7-bits) is like the 7-bits which start the pseudo random code generator shown in FIG. 9. Each 7-bit code is the starting point for the generation of a code which when applied to its allocated column Y-electrode will give coincidence of code at a row whose position represents the amplitude value of a sample of the signal waveform.

When the load pulse drops to zero each multiplexer 118 to 124 has its '0' input connected to its Q output thereby connecting the shift registers 125 to 131 head to tail. Thus when master clock 109 pulses CS and CP are applied to the shift registers 125 to 131 the information in the Y-register 125 is transferred into the second bit register 126; information in the second bit register 126 is transferred in the third bit register and so on. Additionally the output $Q_0$ from the Y-register 125 is combined with the output $Q_6$ from the 7th bit register 131 in the exclusive 'OR' gate 132, 133 into the input of the Y register 125.

After 128 master clock 109 pulses the content of the Y-register 125 is clocked, by application of a strobe pulse Z, into the column electrodes of the display 1. The overall effect of the seven registers 125 to 131 clocked at master clock frequency f and the Y-register 125 strobed at frequency f' is similar to that of 128 7-bit registers of FIG. 9 with the output of each register connected to a column electrode. This is a pseudo random code generated onto each Y-column electrode at the same frequency as that generated onto the X-row electrodes.

A signal waveform is therefore displayed on the display 1 by the coincidence of pseudo random codes at different X, Y intersections giving zero voltage at those intersections with 0.71 V at other intersections. The waveform continues to be displayed until a fresh signal waveform is to be displayed when a signal is applied to the C input of the first flip flop 108 and the above sequence of filling the various registers and generating the various pseudo random codes is repeated. The storing of a new waveform is initiated by a negative going transition at input 141 of monostable 140. After the time constant ($\tau \approx 0.05$ to 0.5 sec) of the monostable 140, during which its output 142 is high, the monostable output 142 goes low and this negative transition re-arms the trigger circuit of the transient recorder so that it will trigger at the next appropriate point on the input signal and restart the load sequence.

The ROM 116 is programmed so that its output provides a point for generation of a pseudo random code which is related to the input amplitude sample value and the waveform on the X-row electrodes. For example the minimum value samples could be displayed at row $R_0$ and thus the ROM output, for such a minimum input would provide the start for a pseudo random waveform identical to that suplied to row $R_0$ from the X-register 100 output $Q_0$.

The ROM program for use with the circuit of FIG. 10 with an initial row pseudo random starting code of 10 00 00 00 in the 8-bit register 102 is shown in the following Table 4.

TABLE 4

| Programme of Read Only Memory | | | |
|---|---|---|---|
| Address in ROM | ROM output | Address in ROM | ROM output |
| 0 | 1 1 0 0 0 0 0 | 24 | 1 0 1 0 0 1 1 |
| 1 | 1 0 0 0 0 0 1 | 25 | 0 1 0 0 1 1 0 |
| 2 | 0 0 0 0 0 1 0 | 26 | 1 0 0 1 1 0 0 |
| 3 | 0 0 0 0 1 0 0 | 27 | 0 0 1 1 0 0 1 |
| 4 | 0 0 0 1 0 0 0 | 28 | 0 1 1 0 0 1 1 |
| 5 | 0 0 1 0 0 0 0 | 29 | 1 1 0 0 1 1 1 |
| 6 | 0 1 0 0 0 0 0 | 30 | 1 0 0 1 1 1 0 |
| 7 | 1 0 0 0 0 0 0 | 31 | 0 0 1 1 1 0 1 |
| 8 | 0 0 0 0 0 0 1 | 32 | 0 1 1 1 0 1 1 |
| 9 | 0 0 0 0 0 1 1 | 33 | 1 1 1 0 1 1 1 |
| 10 | 0 0 0 0 1 1 1 | 34 | 1 1 0 1 1 1 0 |
| 11 | 0 0 0 1 1 1 1 | 35 | 1 0 1 1 1 0 1 |
| 12 | 0 0 1 1 1 1 1 | 36 | 0 1 1 1 0 1 0 |
| 13 | 0 1 1 1 1 1 1 | 37 | 1 1 1 0 1 0 0 |
| 14 | 1 1 1 1 1 1 1 | 38 | 1 1 0 1 0 0 1 |
| 15 | 1 1 1 1 1 1 0 | 39 | 1 0 1 0 0 1 0 |
| 16 | 1 1 1 1 1 0 1 | 40 | 0 1 0 0 1 0 1 |
| 17 | 1 1 1 1 0 1 0 | 41 | 1 0 0 1 0 1 1 |
| 18 | 1 1 1 0 1 0 1 | 42 | 0 0 1 0 1 1 0 |
| 19 | 1 1 0 1 0 1 0 | 43 | 0 1 0 1 1 0 0 |
| 20 | 1 0 1 0 1 0 1 | 44 | 1 0 1 1 0 0 0 |
| 21 | 0 1 0 1 0 1 0 | 45 | 0 1 1 0 0 0 1 |
| 22 | 1 0 1 0 1 0 0 | 46 | 1 1 0 0 0 1 1 |
| 23 | 0 1 0 1 0 0 1 | 47 | 1 0 0 0 1 1 0 |
| 48 | 0 0 0 1 1 0 1 | 75 | 0 0 0 1 1 1 0 |
| 49 | 0 0 1 1 0 1 1 | 76 | 0 0 1 1 1 0 0 |
| 50 | 0 1 1 0 1 1 1 | 77 | 0 1 1 1 0 0 0 |
| 51 | 1 1 0 1 1 1 1 | 78 | 1 1 1 0 0 0 0 |
| 52 | 1 0 1 1 1 1 0 | 79 | 1 1 0 0 0 0 1 |
| 53 | 0 1 1 1 1 0 1 | 80 | 1 0 0 0 0 1 0 |
| 54 | 1 1 1 1 0 1 1 | 81 | 0 0 0 0 1 0 1 |
| 55 | 1 1 1 0 1 1 0 | 82 | 0 0 0 1 0 1 1 |
| 56 | 1 1 0 1 1 0 1 | 83 | 0 0 1 0 1 1 1 |
| 57 | 1 0 1 1 0 1 0 | 84 | 0 1 0 1 1 1 1 |
| 58 | 0 1 1 0 1 0 1 | 85 | 1 0 1 1 1 1 1 |
| 59 | 1 1 0 1 0 1 1 | 86 | 0 1 1 1 1 1 0 |
| 60 | 1 0 1 0 1 1 0 | 87 | 1 1 1 1 1 0 0 |
| 61 | 0 1 0 1 1 0 1 | 88 | 1 1 1 1 0 0 1 |
| 62 | 1 0 1 1 0 1 1 | 89 | 1 1 1 0 0 1 0 |
| 63 | 0 1 1 0 1 1 0 | 90 | 1 1 0 0 1 0 1 |
| 64 | 1 1 0 1 1 0 0 | 91 | 1 0 0 1 0 1 0 |
| 65 | 1 0 1 1 0 0 1 | 92 | 0 0 1 0 1 0 1 |
| 66 | 0 1 1 0 0 1 0 | 93 | 0 1 0 1 0 1 1 |
| 67 | 1 1 0 0 1 0 0 | 94 | 1 0 1 0 1 1 1 |
| 68 | 1 0 0 1 0 0 1 | 95 | 0 1 0 1 1 1 0 |
| 69 | 0 0 1 0 0 1 0 | 96 | 1 0 1 1 1 0 0 |
| 70 | 0 1 0 0 1 0 0 | 97 | 0 1 1 1 0 0 1 |
| 71 | 1 0 0 1 0 0 0 | 98 | 1 1 1 0 0 1 1 |
| 72 | 0 0 1 0 0 0 1 | 99 | 1 1 0 0 1 1 0 |
| 73 | 0 1 0 0 0 1 1 | 100 | 1 0 0 1 1 0 1 |
| 74 | 1 0 0 0 1 1 1 | 101 | 0 0 1 1 0 1 0 |
| 102 | 0 1 1 0 1 0 0 | | |
| 103 | 1 1 0 1 0 0 0 | | |
| 104 | 1 0 1 0 0 0 1 | | |
| 105 | 0 1 0 0 0 1 0 | | |
| 106 | 1 0 0 0 1 0 0 | | |
| 107 | 0 0 0 1 0 0 1 | | |
| 108 | 0 0 1 0 0 1 1 | | |
| 109 | 0 1 0 0 1 1 1 | | |
| 110 | 1 0 0 1 1 1 1 | | |
| 111 | 0 0 1 1 1 1 0 | | |
| 112 | 0 1 1 1 1 0 0 | | |
| 113 | 1 1 1 1 0 0 0 | | |
| 114 | 1 1 1 0 0 0 1 | | |
| 115 | 1 1 0 0 0 1 0 | | |
| 116 | 1 0 0 0 1 0 1 | | |
| 117 | 0 0 0 1 0 1 0 | | |
| 118 | 0 0 1 0 1 0 0 | | |
| 119 | 0 1 0 1 0 0 0 | | |
| 120 | 1 0 1 0 0 0 0 | | |
| 121 | 0 1 0 0 0 0 1 | | |

TABLE 4-continued

| Programme of Read Only Memory | | | |
|---|---|---|---|
| Address in ROM | ROM output | Address in ROM | ROM output |
| 122 | 1 0 0 0 0 1 1 | | |
| 123 | 0 0 0 0 1 1 0 | | |
| 124 | 0 0 0 1 1 0 0 | | |
| 125 | 0 0 1 1 0 0 0 | | |
| 126 | 0 1 1 0 0 0 0 | | |

I claim:

1. Apparatus for displaying waveforms comprising:
   (i) an electro optic display having a layer of display material between two dielectric substrates, a first series of m strip electrodes on one substrate and a second series of n strip electrodes on the other substrate arranged to define an m×n plurality of elements across which an electric signal may be applied to change the layer from one state to another thereby causing an observable display effect;
   (ii) means for generating m different reference waveforms from different L-bit, N'-ary numbers whereby each waveform has a different shape over a period t, L and N' being integers greater than 1;
   (iii) means for simultaneously applying a different one of said reference waveforms to each electrode in the first series of electrodes;
   (iv) sampling means for providing a series of discrete amplitude values of the waveform signal to be displayed;
   (v) means for selectively generating and storing ones of the m different reference waveforms, the generated waveforms representing the value of each amplitude sample relative to the order of the reference waveforms applied to the first set of electrodes, and for selectively applying such selectively generated waveforms concurrently to a plurality of the second series of electrodes;
   (vi) whereby an alternating voltage with an rms value greater than a display effect threshold voltage is maintained across some non-selected elements of the display so that these elements are in a first state and a substantially zero rms voltage exists simultaneously across selected elements which are defined by one electrode of said first series of electrodes and by one electrode of said second series of electrodes to which the same waveforms are applied so that these elements are in their second state and collectively display the waveform signal.

2. Apparatus according to claim 1 wherein the electro optic display in a liquid crystal cell display and the layer of display material is a liquid crystal material.

3. Apparatus according to claim 2 wherein the liquid crystal material is a nematic material, the substrates are treated so the liquid crystal material can rotate the plane of polarised light and the cell is arranged between polarisers.

4. Apparatus according to claim 2 wherein the liquid crystal material is a cholesteric material.

5. Apparatus according to claim 2 wherein a reflector is arranged behind the cell and display observed by reflected light.

6. Apparatus according to claim 1 wherein the electro optic display is an electro luminescent display.

7. Apparatus according to claim 1 wherein the means for generating the m different coded waveforms generates a binary coded waveform of period T divided into N bits where $m=2^N$.

8. Apparatus according to claim 1 wherein the means for generating the m different coded waveforms generates $2^N$ binary coded waveforms of period T divided into L bits where L is greater than N.

9. Apparatus according to claim 1 wherein the means for generating m different coded waveforms generates pseudo random coded waveforms.

10. Apparatus according to claim 8 wherein the means for generating m different coded waveforms is a programmed memory.

11. Apparatus according to claim 8 wherein the means for generating m different coded waveforms is a binary counter having a plurality of outputs terminals whose outputs in the form of logic zeros and ones provide a different waveform for each number generated.

12. Apparatus according to claim 9 wherein the means for generating m different coded waveforms is a shift register with modulo two feedback.

13. Apparatus according to claim 1 wherein the means for applying the m different reference waveforms to the first series of electrodes comprises a shift and store bus register.

14. Apparatus according to claim 1 wherein the sampling means comprises an analogue to digital converter.

15. Apparatus according to claim 14 wherein the sampling means comprises means for reading in a waveform to be displayed at a first frequency and reading out to the analogue to digital converter at a second and different frequency.

16. Apparatus according to claim 15 wherein the means for reading in and out at different frequencies is a charge coupled device.

17. Apparatus according to claim 15 wherein buffer stores are provided between the sampling means and the means for selectively generating ones of the m different reference waveforms.

18. Apparatus according to claim 8 wherein the means for selectively generating ones of the m different reference waveforms for application to the second series of electrodes comprises an analogue to digital converter.

19. Apparatus according to claim 8 wherein the means for selectively generating ones of the m different reference waveforms for application to the second series of electrodes comprises a programmed memory.

20. Apparatus according to claim 9 wherein the means for selectively generating ones of the m different reference waveforms for application to the second series of electrodes comprises a programmed memory, and shift registers with a modulo two feedback between a first and an N bit output.

21. Apparatus according to claim 1 wherein the means for selectively applying the selectively generated reference waveforms to the second series of electrodes comprises a shift and store bus register.

* * * * *